United States Patent
Armstrong et al.

(10) Patent No.: US 9,653,635 B2
(45) Date of Patent: May 16, 2017

(54) FLEXIBLE HIGH-VOLTAGE ADAPTABLE CURRENT PHOTOVOLTAIC MODULES AND ASSOCIATED METHODS

(71) Applicant: Ascent Solar Technologies, Inc., Thornton, CO (US)

(72) Inventors: Joseph H. Armstrong, Littleton, CO (US); Matthew B. Foster, Lone Tree, CO (US); Jonathan S. Port, Pacific Palisades, CA (US); Douglas G. Jensen, Lakewood, CO (US)

(73) Assignee: ASCENT SOLAR TECHNOLOGIES, INC., Thornton, CO (US)

( * ) Notice: Subject to any disclaimer, the term of this patent is extended or adjusted under 35 U.S.C. 154(b) by 285 days.

(21) Appl. No.: 14/041,886

(22) Filed: Sep. 30, 2013

(65) Prior Publication Data

US 2014/0030841 A1 Jan. 30, 2014

Related U.S. Application Data

(63) Continuation of application No. 11/877,632, filed on Oct. 23, 2007, now abandoned.
(Continued)

(51) Int. Cl.
*H01L 31/05* (2014.01)
*H01L 31/02* (2006.01)
(Continued)

(52) U.S. Cl.
CPC .... *H01L 31/0504* (2013.01); *H01L 31/02008* (2013.01); *H01L 31/02021* (2013.01);
(Continued)

(58) Field of Classification Search
CPC ......... H01L 31/02008; H01L 31/02021; H01L 31/048; H01L 31/0504
See application file for complete search history.

(56) References Cited

U.S. PATENT DOCUMENTS 4,617,421 A 10/1986 Nath et al.
4,724,010 A 2/1988 Okaniwa et al.
(Continued)

FOREIGN PATENT DOCUMENTS

JP 61082485 4/1986
JP 08186280 7/1996
(Continued)

OTHER PUBLICATIONS

U.S. Appl. No. 11/877,625, Notice of Allowance and Examiner Interview Summary dated Jul. 26, 2010, 11 pages.
(Continued)

*Primary Examiner* — Seahvosh Nikmanesh
(74) *Attorney, Agent, or Firm* — Lathrop & Gage LLP

(57) ABSTRACT

A flexible photovoltaic module for converting light into an electric current includes a plurality of electrically interconnected flexible photovoltaic submodules monolithically integrated onto a common flexible substrate. Each photovoltaic submodule includes a plurality of electrically interconnected flexible thin-film photovoltaic cells monolithically integrated onto the flexible substrate. A flexible photovoltaic module for converting light into an electric current includes a backplane layer for supporting the photovoltaic module. A first pottant layer is disposed on the backplane layer, and a photovoltaic submodule assembly is disposed on the first pottant layer. The photovoltaic submodule assembly has at least one photovoltaic submodule, where each photovoltaic submodule includes a plurality of thin-film photovoltaic cells. A second pottant layer is disposed on the photovoltaic submodule assembly, and a upper laminate layer disposed on the second pottant layer.

14 Claims, 13 Drawing Sheets

Related U.S. Application Data

(60) Provisional application No. 60/853,609, filed on Oct. 23, 2006, provisional application No. 60/853,610, filed on Oct. 23, 2006.

(51) Int. Cl.
*H01L 31/048* (2014.01)
*H02S 10/00* (2014.01)
*H02S 40/36* (2014.01)

(52) U.S. Cl.
CPC ............ *H01L 31/048* (2013.01); *H02S 10/00* (2013.01); *H02S 40/36* (2014.12); *Y02E 10/50* (2013.01); *Y10S 136/293* (2013.01); *Y10T 29/49355* (2015.01)

(56) References Cited

U.S. PATENT DOCUMENTS

| | | | |
|---|---|---|---|
| 4,860,509 A | 8/1989 | Laaly et al. | |
| 5,593,901 A | 1/1997 | Oswald et al. | |
| 5,990,414 A | 11/1999 | Posnansky | |
| 5,998,729 A | 12/1999 | Shiomi et al. | |
| 6,093,884 A | 7/2000 | Toyomura et al. | |
| 6,295,818 B1 | 10/2001 | Ansley et al. | |
| 6,310,281 B1 | 10/2001 | Wendt et al. | |
| 6,311,436 B1 | 11/2001 | Mimura et al. | |
| 6,372,538 B1 | 4/2002 | Wendt et al. | |
| 6,465,724 B1 | 10/2002 | Garvison et al. | |
| 6,472,593 B1 | 10/2002 | Middelman et al. | |
| 6,675,580 B2 | 1/2004 | Ansley et al. | |
| 6,729,081 B2 | 5/2004 | Nath et al. | |
| 7,019,207 B2 | 3/2006 | Harneit et al. | |
| 7,271,333 B2 | 9/2007 | Fabick et al. | |
| 7,812,247 B2 * | 10/2010 | Armstrong | H01L 31/02008 136/244 |
| 2001/0045228 A1 | 11/2001 | Takada et al. | |
| 2001/0050102 A1 | 12/2001 | Matsumi et al. | |
| 2002/0046764 A1 | 4/2002 | Ansley et al. | |
| 2003/0068559 A1 | 4/2003 | Armstrong et al. | |
| 2005/0012021 A1 | 1/2005 | Middelman et al. | |
| 2005/0072461 A1 | 4/2005 | Kuchinski et al. | |
| 2005/0115176 A1 | 6/2005 | Russell | |
| 2005/0133082 A1 | 6/2005 | Konold et al. | |
| 2005/0224108 A1 | 10/2005 | Cheung | |

FOREIGN PATENT DOCUMENTS

| | | |
|---|---|---|
| JP | 10135499 | 5/1998 |
| JP | 2002009326 | 1/2002 |
| JP | 2003298100 | 10/2003 |
| WO | 2009011790 A2 | 1/2009 |

OTHER PUBLICATIONS

Prometheus Institute, The Future of Thin Film PV, PVNews, Aug. 2006, pp. 3-5.
Barnubus Energy Inc., SolarSave Photovoltaic Modules, Dr. Heshmat Laaly, Research & Development, www.barnabusenergy.com, retrieved from website, Sep. 27, 2006, pp. 1-5.
Islam, S. & Belmans, R., Field Testing of Plug and Play Type AC Modules: Performance and Monitoring Results, Aug. 10, 2001, pp. 1-12.
Miasole Closes $5.4 Million in Funding, Appoints New Member to Board of Disclosures, www.prnewswire.com, retrieved on Sep. 20, 2006.
Photo-Voltaic Manufacturing Technology Fact Sheet, Iowa Thin Film Technologies, Inc., Jul. 2000, p. 1-2.
Gartner, John, Solar to Keep Army on the Go, www.Rense.com, Wired News, Jun. 29, 2004, p. 1-3.
Solar Roofing Systems, Inc., Product Specifications, SolarSave, Premiere Series, Solar Electric Roofing Modules, Model SP480, www.solarsave.com, p. 1-2.
Powerfilm Solar, Technical Data Sheet, Military Solar Quadrant, Field Shelter With Integrated Solar Power—190 Watts., www.powerfilmsolar.com, PowerFilm Solar, Aug. 9, 2005, p. 1.
Powerfilm Solar, Technical Data Sheet, Military Solar Temper Fly, Field Shelter With Integrated Solar Power—750 Watts., www.powerfilmsolar.com, PowerFilm Solar, Aug. 9, 2005, p. 1.
Powerfilm Solar, Technical Data Sheet, Military Solar Power Shade, Field Shelter With Integrated Solar Power—1 Kilowatt, www.powerfilmsolar.com, PowerFilm Solar, Aug. 9, 2005, p. 1.
Powerfilm Solar, Technical Data Sheet, Military Solar Power Shade, Medium, Field Shelter With Integrated Solar Power—2 Kilowatt, www.powerfilmsolar.com, PowerFilm Solar, Aug. 9, 2005, p. 1.
Uni-Solar, Flexible Solar Panels, www.alphasolar.com, retrieved from website, Sep. 20, 2006, p. 1.
Bower, W., The AC Building Block—Ultimate Plug-n-Play That Brings Photovoltaics Directly to the Customer, Sandia National Laboratories, Albuquerque, NM, NREL/CD-520-33586, 2003, pp. 311-314.
U.S. Appl. No. 11/877,632, select file history, dated Jan. 9, 2009 through Oct. 24, 2013, 101 pags.

* cited by examiner

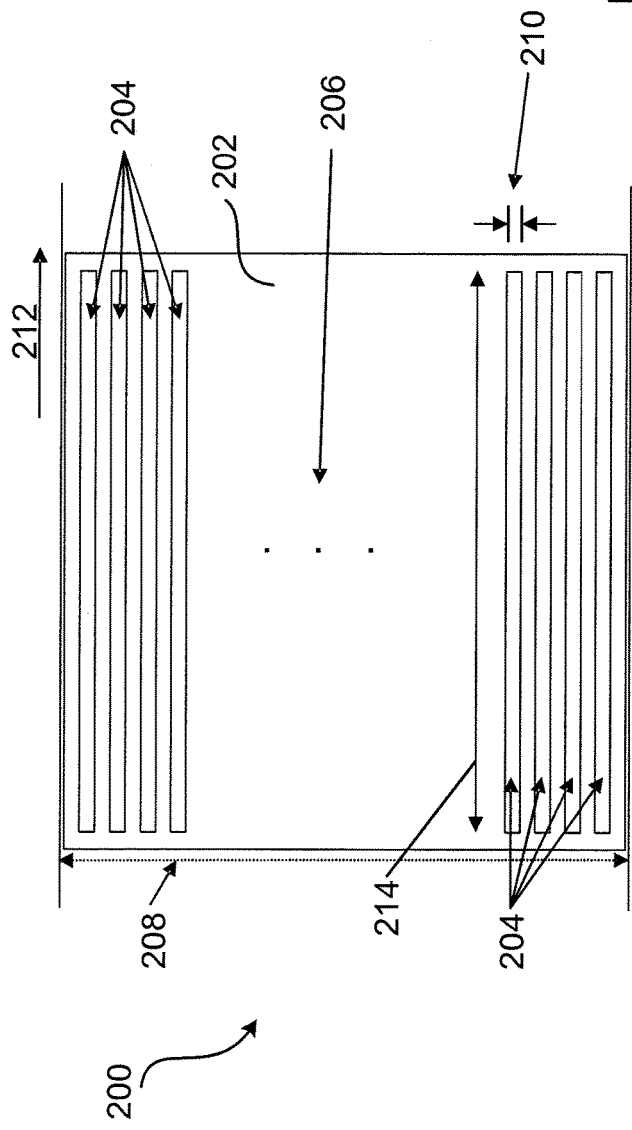
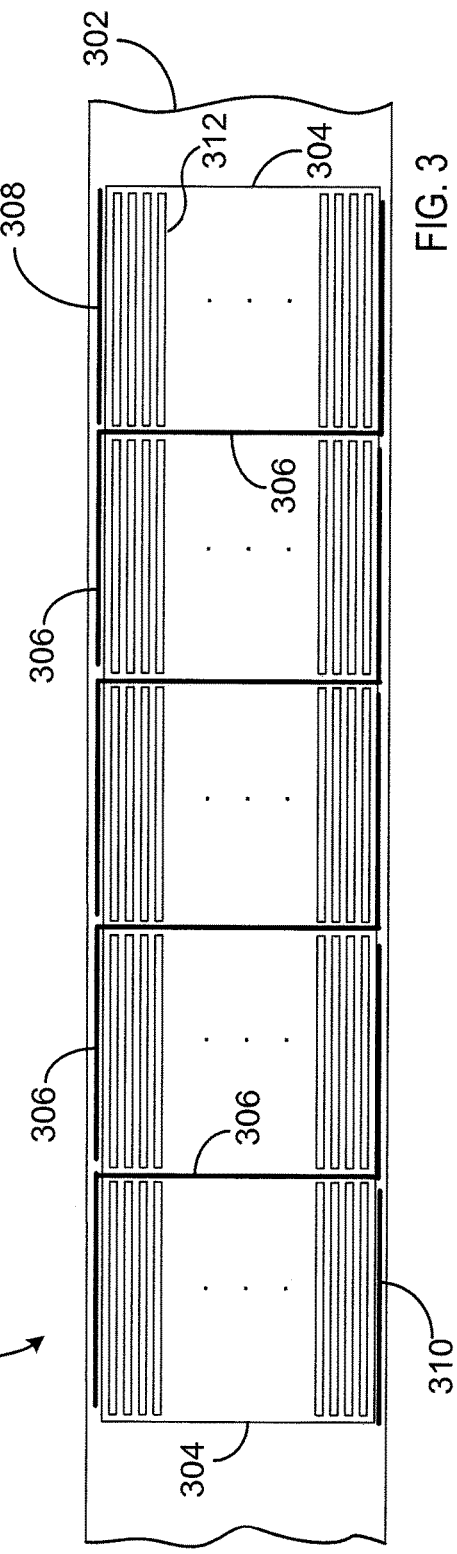

US 9,653,635 B2

FLEXIBLE HIGH-VOLTAGE ADAPTABLE CURRENT PHOTOVOLTAIC MODULES AND ASSOCIATED METHODS

CROSS-REFERENCE TO RELATED APPLICATIONS

This application is a continuation of U.S. patent application Ser. No. 11/877,632, filed 23 Oct. 2007, which claims benefit of priority to U.S. Provisional Patent Application Ser. No. 60/853,609 filed 23 Oct. 2006 and U.S. Provisional Patent Application Ser. No. 60/853,610 filed 23 Oct. 2006. Each of the aforementioned applications is incorporated herein by reference.

BACKGROUND

The conversion of sunlight into electrical power by photovoltaic cells provides a share of the world's renewable energy. However, widespread use of photovoltaic cells to generate electricity has been limited by issues such as the relatively high cost of manufacturing and installing photovoltaic cells as well as the relatively low efficiency of photovoltaic cells.

Traditional photovoltaic electric generation systems require the installation of numerous photovoltaic modules, cabling, junction boxes, and other circuitry to connect the photovoltaic modules in series and parallel to produce a desired voltage and current output. Installing the numerous photovoltaic modules and associated cabling is a time-consuming and expensive process. Furthermore, the photovoltaic modules of these traditional systems have fixed sizes and electrical characteristics, which impedes their ability to meet system design requirements. For example, such photovoltaic modules cannot be sized to accommodate roof obstructions.

SUMMARY

A flexible photovoltaic module for converting light into an electric current includes a plurality of electrically interconnected flexible photovoltaic submodules monolithically integrated onto a common flexible substrate. Each photovoltaic submodule includes a plurality of electrically interconnected flexible thin-film photovoltaic cells monolithically integrated onto the flexible substrate.

A flexible photovoltaic module for converting light into an electric current includes a backplane layer for supporting the photovoltaic module. A first pottant layer is disposed on the backplane layer, and a photovoltaic submodule assembly is disposed on the first pottant layer. The photovoltaic submodule assembly has at least one photovoltaic submodule, where each photovoltaic submodule includes a plurality of thin-film photovoltaic cells. A second pottant layer is disposed on the photovoltaic submodule assembly, and an upper laminate layer disposed on the second pottant layer.

BRIEF DESCRIPTION OF THE DRAWINGS

FIG. 2 is a top plan view of one flexible photovoltaic submodule, according to an embodiment.

FIG. 3 is a top plan view of one flexible photovoltaic module, according to an embodiment.

DETAILED DESCRIPTION

Figure 1:
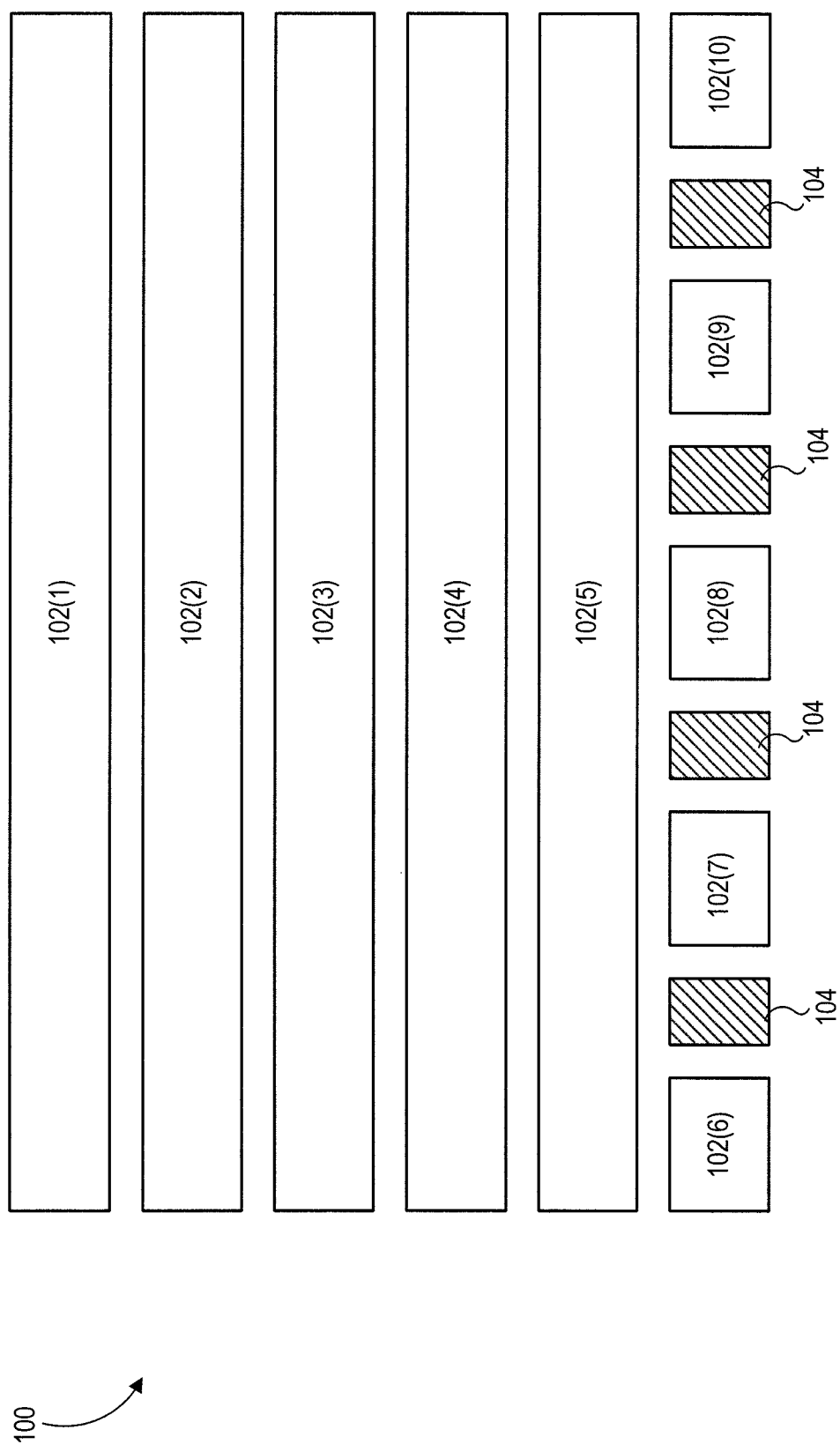
FIG. 1 is a top plan view of one solar power generation system for generating electricity from light, according to an embodiment.

It is noted that, for purposes of illustrative clarity, certain elements in the drawings may not be drawn to scale. Specific instances of an item may be referred to by use of a numeral in parentheses (e.g., photovoltaic module 102(1)) while numerals without parentheses refer to any such item (e.g., photovoltaic module 102). In the present disclosure disclosure, "cm" refers to centimeters, "m" refers to meters, "A" refers to amperes, "mA" refers to miliamperes, and "V" refers to volts.

FIG. 1 is a top plan view of one solar power generation system 100 for generating electricity from light (e.g., sunlight). Solar power generation system 100 includes a plurality of photovoltaic modules 102. Photovoltaic modules 102 are electrically interconnected; however the electrical connections are not shown in FIG. 1 in order to promote illustrative clarity.

Photovoltaic modules 102 are manufacturable in various sizes to accommodate the size of an installation site as well as obstructions 104 such as roof vents and skylights. In the example illustrated in FIG. 1, photovoltaic modules 102(1)-102(5) are full length, while photovoltaic modules 102(6)-102(10) are reduced length in order to accommodate obstructions 104.

Photovoltaic modules 102 may be manufactured with a desired open circuit output voltage to match the designated system voltage for a planned installation, thereby obviating any need for series interconnections between photovoltaic modules 102. For example, each of photovoltaic modules 102 may have the same open circuit output voltage and may be connected in parallel. Furthermore, a desired maximum current capability of solar power generation system 100 may be achieved by combining photovoltaic modules 102 in parallel.

Each photovoltaic modules 102 includes one or more photovoltaic submodules. An example of such photovoltaic submodule is shown in FIG. 2, which is a top plan view of one photovoltaic submodule 200. Photovoltaic submodule 200 has a flexible web substrate 202 that is, for example, a metal foil such as stainless steel or a polyimide sheet material. Accordingly, photovoltaic submodules 200 are flexible, and photovoltaic module 102 may also be flexible.

A plurality of photovoltaic cells 204 are disposed on and defined by monolithic integration on substrate 202, and thereby occupy a portion of submodule area 206. Photovoltaic cells 204 are thin-film devices that are sequentially deposited by a variety of means to achieve desired electrical and mechanical properties. Cell dimensions are defined by monolithic integration which includes patterning by mechanical, chemical etch, laser, and/or direct write means that also define a series of electrical interconnects.

Photovoltaic cells 204 are defined, for example, by creating a plurality of scribes and electrical connections in a stack of thin-film layers. The stack of thin-film layers includes, for example, a back contact layer formed on substrate 202, a solar absorber layer formed on the back contact layer, a window layer formed on the solar absorber layer, and a top contact layer formed on the solar absorber layer. The solar absorber layer includes, for example, one of copper-indium-gallium-selenium (CIGS), copper-indium-gallium-selenium-sulfur (CIGSS), copper-indium-aluminum-selenium (CIAS), copper-indium-gallium-aluminum-selenium (CIGAS), copper-indium-gallium-aluminum-selenium-sulphur (CIGASS), cadmium-telluride (CdTe), polycrystalline silicon, and amorphous silicon (a-Si) or combinations thereof. As described herein below, cell type (e.g., solar absorber material) may govern or affect length, quantity, and electrical characteristics of photovoltaic cells 204 and photovoltaic submodule 200.

The number of photovoltaic cells 204 of photovoltaic submodule 200 is for example determined by a web width 208 and a minimum or maximum desired cell breadth 210 when cells are scribed along a web transport direction, indicated by arrow 212, or by the length of the web along web transport direction 212 in the event cells are patterned perpendicular to the web length. The cell breadth 210 varies according to photovoltaic cell manufacturing technique and/or design, which may also affect the open circuit output voltage and maximum current generated by each photovoltaic cell 204. A maximum quantity of photovoltaic cells 204 may be limited by minimum per-cell active area requirements which constrain the minimum surface area of photovoltaic cells 204. The breadth 210 of photovoltaic cells 204 may likewise be constrained by conductivity limitations of thin films conductors that are part of the photovoltaic cells. For example, if the electrical conductivity of the connecting films is low, the films may dissipate power generated by photovoltaic cells 204—in such case, it may be desirable to reduce the breadth of photovoltaic cells 204 to reduce maximum current output, reduce the current path distance from the top of one cell to the bottom of the adjacent cell, and thus minimize power loss in connections between photovoltaic cells 204.

Thin-film photovoltaic cells 204 may be formed on or with substrate 202 by deposition, printing, or other continuous web, roll-to-roll, processing techniques. Photovoltaic cells 204 are, for example, deposited or printed parallel to web transport direction 212.

The current generated by a photovoltaic cell 204 depends in part on the photovoltaic material in the photovoltaic cell and the material's current density, and thus, the total area of the cell. Where cell breadth 210 is fixed, current density of the cell material may be considered and cell width 214 adjusted to produce desired current-generating characteristics. In one example, cell breadth 210 is 0.4 cm, and the current density of photovoltaic cell 204 is 30 mA/cm$^2$. Assuming a desired current output of 10 A, the required area of each cell 204 in the series string is 333 cm$^2$. Based on the given cell breadth 210 of 0.4 cm, cell width 214 is 833 cm. In another example, cell breadth 210 is 0.4 cm, and the current density of photovoltaic cell 204 is 30 mA/cm$^2$. Assuming a desired current output of 5 A, the required area of each photovoltaic cell 204 is 167 cm$^2$. Based upon the given 0.4 cm breadth 210, the cell width 214 is 417 cm. In this example, although the 5 A photovoltaic cell is half the length of the 10 A cell, both photovoltaic cells produce approximately the same output voltage.

The quantity of series connected photovoltaic cells 204 in photovoltaic submodule 200 is determinable during manufacture, e.g., by inputting specifications into a computer controlled roll-to-roll continuous web processing system to determine the open circuit output voltage generated by photovoltaic submodule 200. Open circuit output voltage ratings of photovoltaic submodules 200 are therefore customizable to meet specifications of an installation site and/or for compliance with building codes. For a given photovoltaic submodule/module width, the open circuit output voltage produced by photovoltaic module 102 is dictated by the number of photovoltaic cells that are electrically connected in series—such series connection of photovoltaic cells may be referred to as a string of photovoltaic cells. Module open circuit output voltage realistically ranges, for example, from a minimum of 7 V to as high as 1,000 V according to application, associated codes, and design requirements. Thus, embodiments of photovoltaic modules 102 may have a significantly higher open circuit output voltage than prior art photovoltaic modules. Accordingly, such embodiments may be referred to as high voltage photovoltaic modules.

Each photovoltaic submodule 200 may be an independent, monolithically-integrated thin-film photovoltaic device with multiple photovoltaic cells 204. Photovoltaic submodule 200 is, for example, structurally separate from adjacent submodules or other structures. In one embodiment, each photovoltaic cell 204 is 0.4 centimeters in breadth 210 and generates an open circuit output voltage of 0.5 V. Flexible web substrate 202 has a web width 208, for example, of one meter. Web width 208 and cell breadth 210 permit, for example, 240 cells across the web (in the direction of web width 208), providing an open circuit output voltage of 120 V across photovoltaic submodule 200.

In one embodiment, a plurality of photovoltaic submodules 200 are monolithically integrated on a continuous web substrate 202 to form photovoltaic module 102. Each photovoltaic submodule 200 has, for example, 120 photovoltaic cells 204, such that the photovoltaic submodule produces an open circuit output voltage of 60 V. Adjacent photovoltaic submodules 200 are connected in series or in parallel such that photovoltaic module 102 has a desired open circuit output voltage. The quantity of photovoltaic submodules 200 may be determined by overall output requirements for photovoltaic module 102; for example, if a 600 V open circuit output voltage photovoltaic module is desired, five 120 V photovoltaic submodules 200 are monolithically integrated and interconnected in series on one continuous flexible web substrate 202. Various numbers of photovoltaic submodules 200 per module 102, as well as numbers photovoltaic cells 204 per photovoltaic submodule, may be used to achieve the same approximate open circuit output voltage and maximum current capability for a given surface area of photovoltaic module 102. The configuration of submodule 200 may be determined by considering factors such as the available area for placement of the submodule, how configuration affects cost and speed of fabricating the submodule, and how configuration affects the submodule's reliability. It should be noted that the magnitude of current required to be generated by submodule 200 also affects the configuration of submodule 200 because the maximum current generated by a string of series-connected photovoltaic cells 204 is equal to the smallest current produced by a single photovoltaic cell 204 in the string. Thus, to maximize the efficiency of photovoltaic submodule 200, each photovoltaic cell 204 is, for example, designed to produce the same current.

Each photovoltaic module 102 of solar power generation system 100, has for example, the same open circuit output voltage. Accordingly, in such example, photovoltaic modules 102 are combined in parallel, with each module and its adjacent modules being connected by a single parallel connection. Photovoltaic module 102's size may be modified, as described above, without changing the desired open circuit output voltage. A complete solar power generation system (e.g., system 100) may include custom-sized photovoltaic modules to fit around, for example, rooftop obstructions or to better contour to irregular areas of the roof, thereby optimizing the available space on the roof. Installation of solar power generation system 100 is greatly simplified, as photovoltaic modules 202 require only parallel connection to one another, as opposed to parallel and series connections required by conventional solar power devices.

FIG. 3 is a top plan view of one flexible photovoltaic module 300, which is an embodiment of photovoltaic module 102 of FIG. 1. Photovoltaic module 300 is formed on a continuous flexible web substrate 302. Photovoltaic module 300 is a thin-film photovoltaic module including at least one monolithically-integrated photovoltaic submodule 304. Monolithic integration utilizes a process by which mechanical, chemical etch, laser and/or direct write means are employed to define individual photovoltaic cells and electrically interconnect adjacent photovoltaic cells to create a submodule (e.g., submodule 304). Each monolithically integrated photovoltaic module includes a plurality of thin-film photovoltaic submodule monolithically integrated on the common substrate.

Each photovoltaic submodule 304 includes a plurality of photovoltaic cells 312. The photovoltaic cells 312 are formed, for example, by creating a plurality of scribes and electrical connections in a stack of thin film layers. The stack of thin film layers may include at least one back contact layer, at least one solar absorber layer formed on the back contact layer, at least one window layer formed on the solar absorber layer, and a top contact layer formed on the window layer.

In the example of FIG. 3, five photovoltaic submodules 304 are interconnected in series by electrically conductive flexible bus bars 306 within photovoltaic module 300. However, bus bars 306 may electrically connect to each other and to photovoltaic submodules 304 to create series or parallel electrical connections between photovoltaic submodules 304, as desired. Each photovoltaic submodule 304 is monolithically integrated in this example with the same polarity where all submodules 304 have either the same positive or negative terminals on the same side. The approach afforded by bus bar 306 contacting the top contact of one submodule to the bottom contact of the adjacent submodule 304 provides a series interconnect between the two submodules, thereby adding the voltage of the submodules. Photovoltaic module 300 also has two output terminals 308 and 310. As described above with respect to FIGS. 1 and 2, output (e.g., open circuit output voltage and maximum current capability) of photovoltaic module 300 may be customized during manufacture, e.g., by altering submodule 304's cell interconnections or interconnections of photovoltaic cells 312 within submodule 304.

Figure 4:
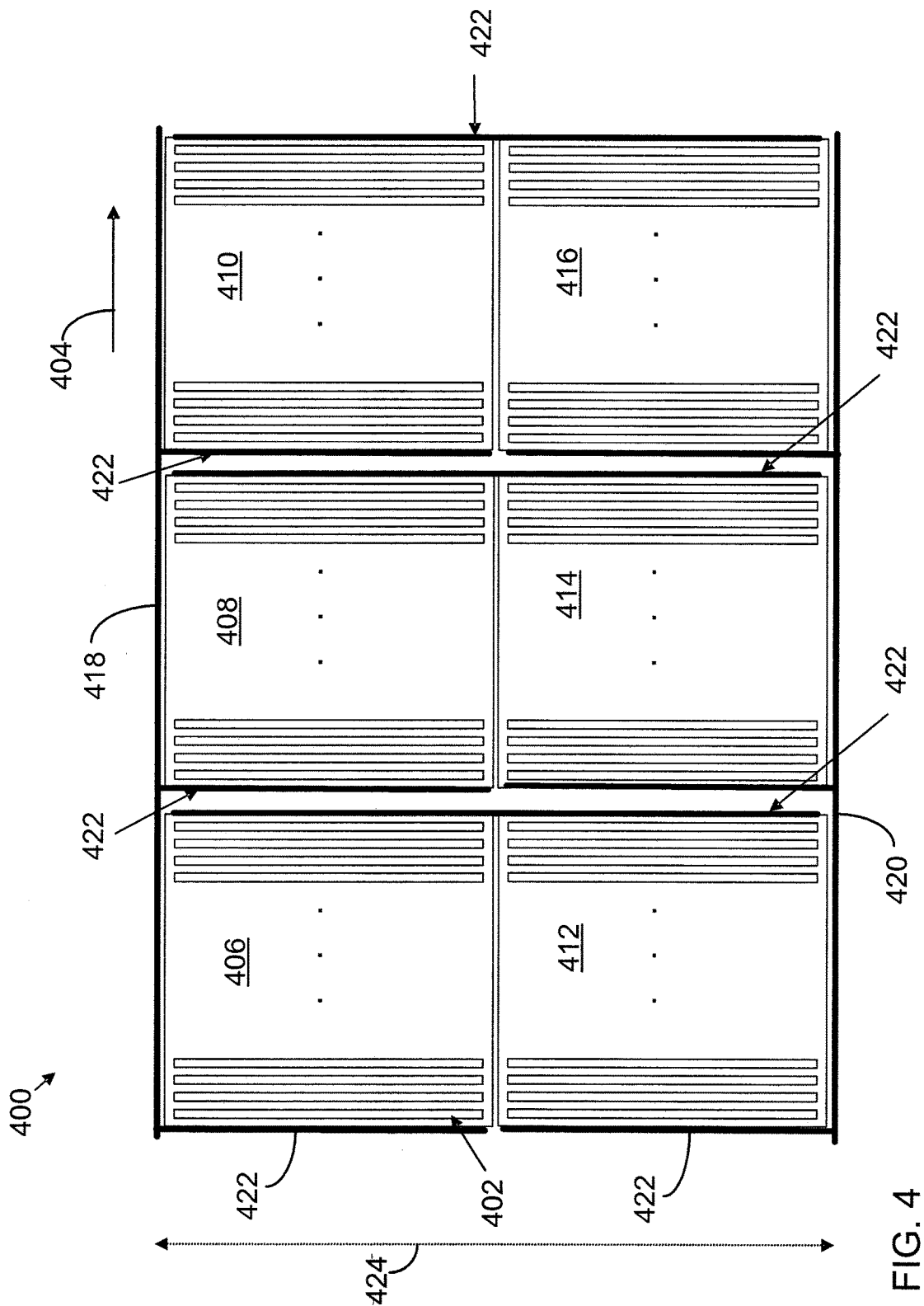
FIG. 4 is a top plan view of one flexible photovoltaic module, according to an embodiment.

As discussed above, a photovoltaic module (e.g., photovoltaic module 102, 300) may be optimized by adjusting the quantity and/or size of the module's constituent photovoltaic cells. Additionally, it is possible to provide photovoltaic submodules with scribing cells perpendicular to those shown above (i.e., perpendicular to the web transport direction) but still on the same common substrate. The relative direction of scribing is, for example, dictated by the manufacturing equipment used to manufacture the photovoltaic modules/ submodules. FIG. 4 is a top plan view of one flexible photovoltaic module 400, which is an embodiment of photovoltaic module 102 of FIG. 1. Photovoltaic module 400 has photovoltaic cells 402 disposed perpendicularly to the web transport direction, indicated by arrow 404. Photovoltaic cells 402 may formed, for example, by a monolithic integration process including creating a plurality of scribes and electrical connections in a stack of thin-film layers formed on a substrate. In such example, the stack of thin-film layers may include a back contact layer formed on the substrate, a solar absorber layer formed on the back contact layer, a window layer formed on the solar absorber layer, and a top contact layer formed on the window layer.

Photovoltaic submodules 406, 408, 410, 412, 414, and 416 are, for example, monolithically integrated onto a common substrate. The photovoltaic submodules are electrically connected in series and/or parallel to produce desired output characteristics (i.e., open circuit output voltage and maximum current capability) at bus bars 418 and 420. Bus bars 422 connect photovoltaic submodules 406, 408, 410, 412, 414 and 416 to each other and to bus bars 418 and 420. In particular, FIG. 4 depicts pairs of adjacent photovoltaic submodules across web width 424; however, a single submodule or three or more submodules may span web width 424. In one embodiment, photovoltaic submodule 406 is connected in series with photovoltaic submodule 412 by bus bar 422, as are photovoltaic submodules 408, 414, and photovoltaic submodules 410,416, respectively. Thus, the top submodules (406, 408, 410) are of opposite polarity than the bottom submodules (412, 414, 416) to permit series interconnection. These photovoltaic submodule pairs are then connected in parallel by bus bars 418 and 420.

Figure 5:
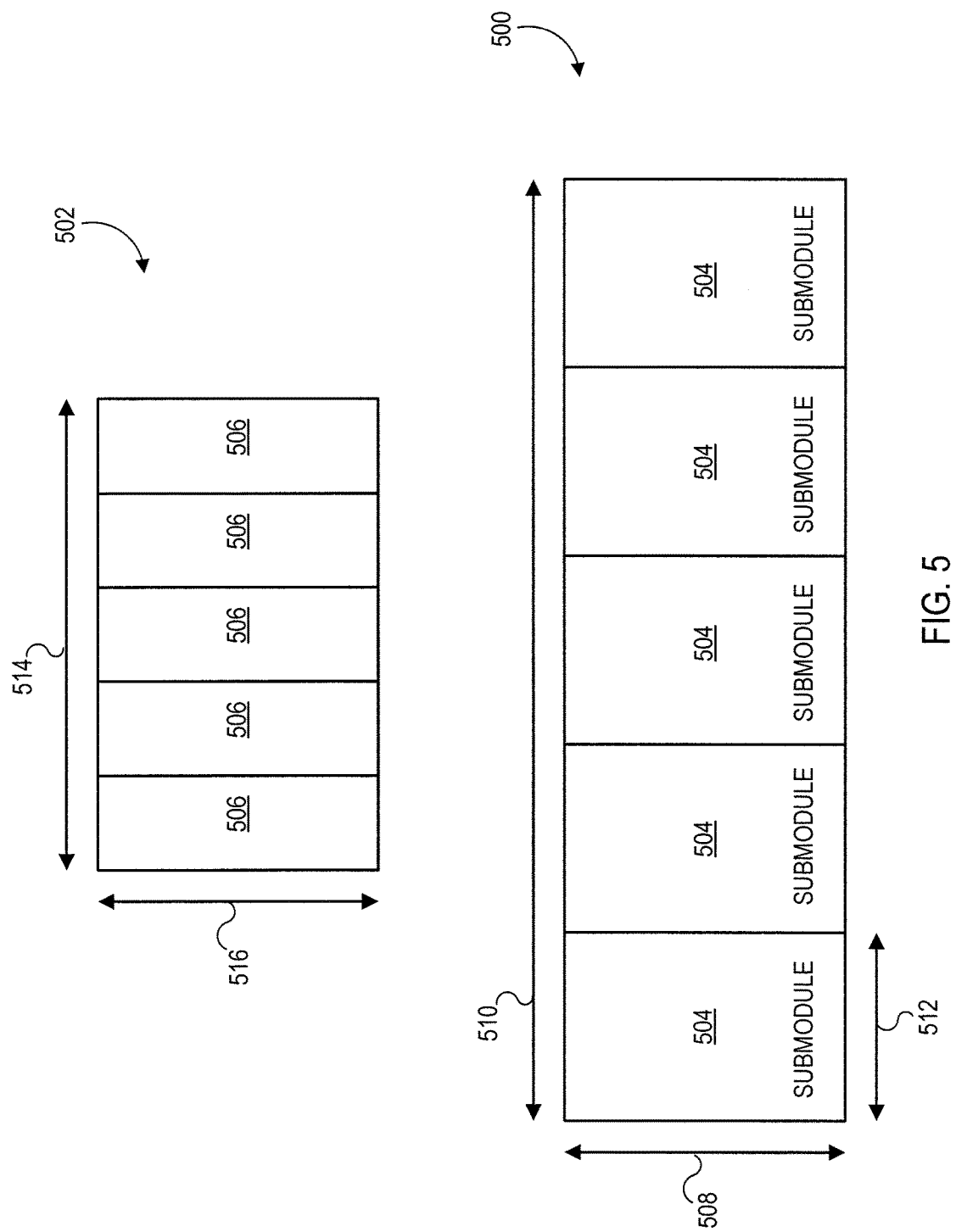
FIG. 5 is a top plan view of two flexible photovoltaic modules, according to an embodiment.

The same open circuit output voltage may be established regardless of photovoltaic module size, where the maximum size may be substantially larger than those used in today's prior art modules. One approach to maintaining a common open circuit output voltage across a plurality of photovoltaic modules having different sizes is to vary the size of the photovoltaic module's constituent submodules while maintaining the same quantity of cells and consequently, open circuit output voltage in each photovoltaic submodule. FIG. 5 is a top plan view of two flexible photovoltaic modules 500 and 502. Photovoltaic module 500 includes five photovoltaic submodules 504, each including a plurality of photovoltaic cells (not shown). Photovoltaic submodules 504, are for example, monolithically integrated on a common substrate. Photovoltaic module 500 has width 508 of 1 m (39.4 inches) and a length 510 of 41.7 m (137.7 feet). Each photovoltaic submodule 504 has a width 512 of 8.3 m (27.4 feet).

In photovoltaic module 500, the five photovoltaic submodules 504 each generate a maximum output current of 10 A and an open circuit output voltage of 120 V. Each of the photovoltaic submodules 504 are electrically connected in series such that photovoltaic module 500 has a maximum current capability of 10 A and an open circuit output voltage of 600 V.

Photovoltaic module 502 has five series-connected photovoltaic submodules 506, each including a plurality of photovoltaic cells (not shown). Photovoltaic submodules 506, are for example, monolithically integrated on a common substrate. Each photovoltaic submodule 506 has a maximum current capability of 5 A and an open circuit output voltage of 120 V. Accordingly, photovoltaic module 502 has a maximum current capability of 5 A and an open circuit output voltage of 600 V. Photovoltaic module 502 has a width 516 of 1 m (39.4 inches) and a length 514 of 21 m (69 feet).

Photovoltaic modules 500 and 502 may in turn be connected in parallel to form a complete or partial system for solar power generation (e.g., an embodiment system 100). Series connections between photovoltaic modules 500 and 502 are advantageously not required because of the relatively high open circuit output voltage of photovoltaic modules 500 and 502. Table 1 below shows characteristics of an embodiment of photovoltaic module 500; similarly, Table 2 below shows characteristics of an embodiment of photovoltaic module 502. It is assumed that current produced, and hence power output, of module 500 is approximately twice that of 502.

TABLE 1

| | |
|---|---|
| Module open circuit output voltage | 600 V |
| Photovoltaic cell open circuit output voltage | 0.5 V |
| Photovoltaic cell current density at maximum power | 30 ma/cm$^2$ |
| Photovoltaic cell breadth | 0.4 cm |
| Web (substrate) width | 1 m |
| Quantity of photovoltaic cells per string | 240 cells/string |
| Photovoltaic cell length | ~8.3 m |

TABLE 2

| | |
|---|---|
| Module open circuit output voltage | 600 V |
| Photovoltaic cell open circuit output voltage | 0.5 V |
| Photovoltaic cell current density at maximum power | 30 ma/cm$^2$ |
| Photovoltaic cell breadth | 0.4 cm |
| Web width | 1 m |
| Quantity of cells per string | 240 cells/string |
| Photovoltaic cell length | ~4.2 m |

The available width on a web for a photovoltaic module may allow for a large quantity of photovoltaic cells to be connected in series, thereby allow the photovoltaic module to have a high open circuit output voltage. However, such large quantity of photovoltaic cells may be result in the photovoltaic module having a larger open circuit output voltage than desired. In such case, the desired open circuit output voltage may be obtained by decreasing the quantity of photovoltaic cells, such as by increasing the width of each photovoltaic cell.

Figure 6:
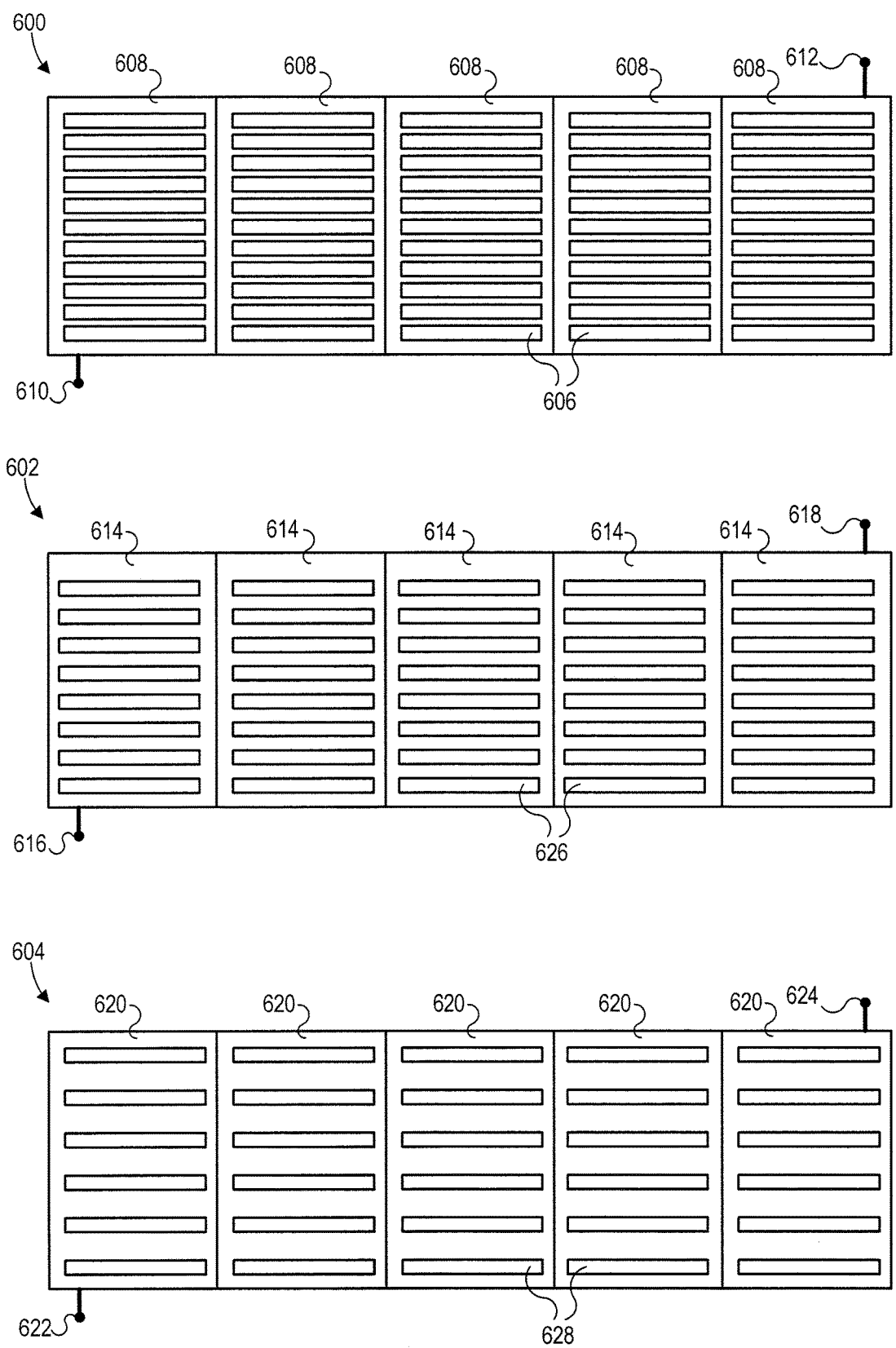
FIG. 6 is a top plan view of three flexible photovoltaic modules, according to an embodiment.

FIG. 6 is a top plan view of three flexible photovoltaic modules 600, 602 and 604. Each photovoltaic module's open circuit output voltage may be customized during manufacturing, e.g., by including a larger or smaller quantity of photovoltaic cells in the photovoltaic submodule. Each photovoltaic module is illustrated in FIG. 6 as including a plurality of photovoltaic cells. However, it should be noted that only a fraction of the photovoltaic cells of each photovoltaic module are shown in FIG. 6 in order to promote illustrate clarity.

Photovoltaic module 600 has five photovoltaic submodules 608, all monolithically integrated on a common substrate, each with 240 series-connected photovoltaic cells 606. Accordingly, each photovoltaic submodule 608 has an open circuit output voltage of 120 V. The photovoltaic submodules 608 are connected in series to provide an open circuit output voltage of 600 V between leads 610 and 612.

Photovoltaic module 602 includes five photovoltaic submodules 614, each with 120 photovoltaic cells 626 connected in series, producing 60 V open circuit output voltage per submodule. Photovoltaic submodules 614 are, for example, monolithically integrated on a common substrate. Photovoltaic submodules 614 are connected in series to provide an open circuit output voltage of 300 V between leads 616 and 618. Photovoltaic module 604 has five photovoltaic submodules 620, with 60 series-connected photovoltaic cells 628 per submodule. Photovoltaic submodules 620 are, for example, monolithically integrated on a common substrate. Photovoltaic submodules 620 each produce an open circuit output voltage of 30 V. The photovoltaic submodules 620 are connected in series to provide an open circuit output voltage of 150 V between leads 622 and 624.

Figure 7:
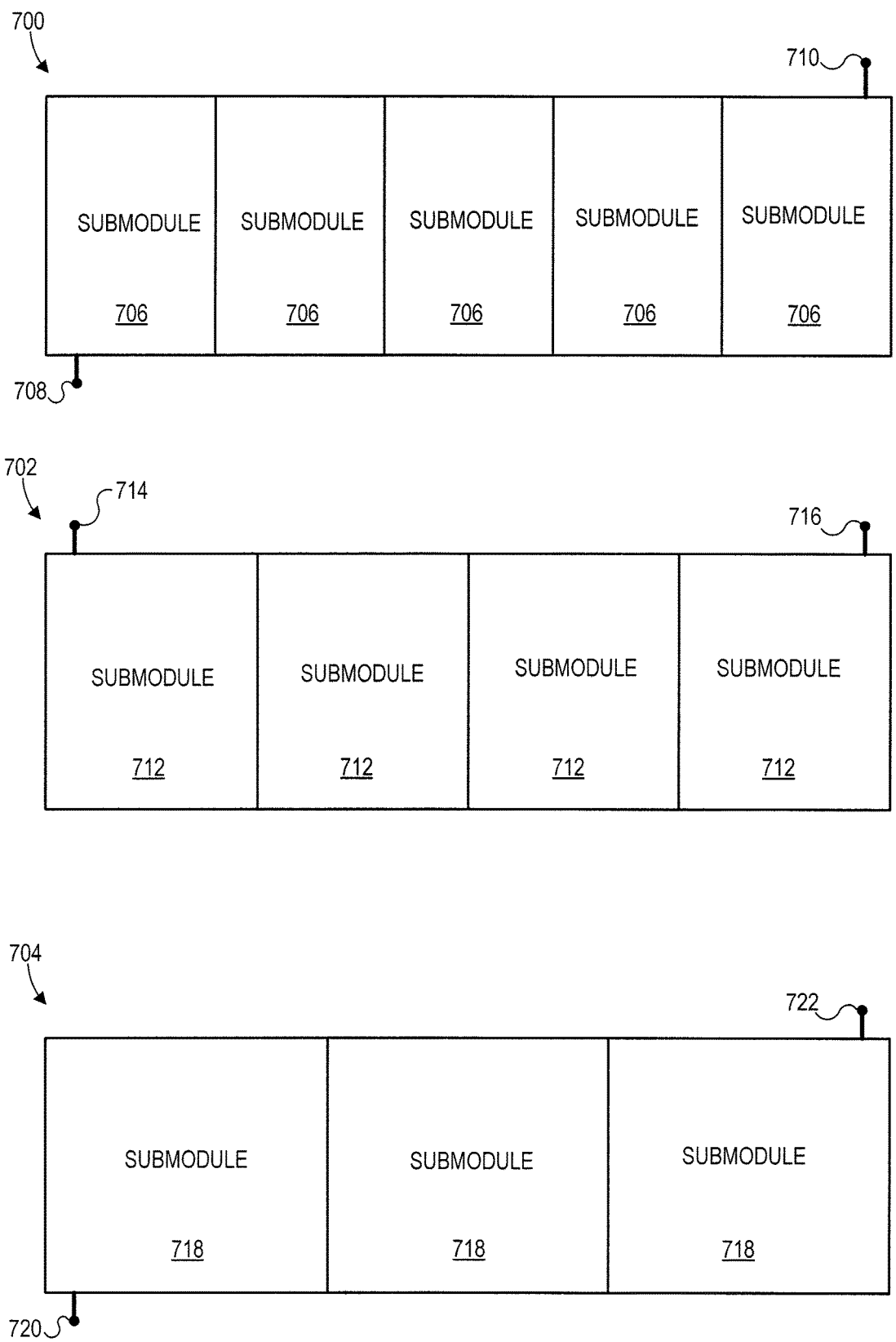
FIG. 7 is a top plan view of three flexible photovoltaic modules, according an embodiment.

As described herein above, a photovoltaic module's output characteristics (i.e., open circuit output voltage and maximum current capability) are set during manufacture, not only by changing the quantity of photovoltaic cells per submodule as illustrated in FIG. 6, but also by changing the quantity of photovoltaic submodules per module. FIG. 7 is a top plan view of three photovoltaic modules 700, 702 and 704, each having photovoltaic submodules 706, 712, and 718, respectively. Photovoltaic submodules 706, 712, and 718 have an equivalent open circuit output voltage; however, the maximum current capability of photovoltaic modules 700, 702 and 704 varies due to variation in the quantity of photovoltaic submodules per photovoltaic module.

Photovoltaic module 700 has five photovoltaic submodules 706, all monolithically integrated on a common substrate, each producing an open circuit output voltage of 120 V. Photovoltaic submodules 706 are electrically connected in series to produce an open circuit output voltage of 600 V between module leads 708 and 710. Photovoltaic module 702 has four photovoltaic submodules 712 each producing an open circuit output voltage 120 V; photovoltaic submodules 712 are, for example, monolithically integrated on a common substrate. Photovoltaic submodules 712 are connected in series to produce an open circuit output voltage of 480 V between module leads 714 and 716. Photovoltaic module 704 has three photovoltaic submodules 718, each producing an open circuit output voltage of 120 V; photovoltaic submodules 718 are, for example, monolithically integrated on a common substrate. Photovoltaic submodules 718 are connected in series to produce an open circuit output voltage 360 V between leads 720 and 722. The quantity of photovoltaic submodules per module (or photovoltaic cells per submodule) may be altered according to design preference and/or power requirements.

Figure 8:
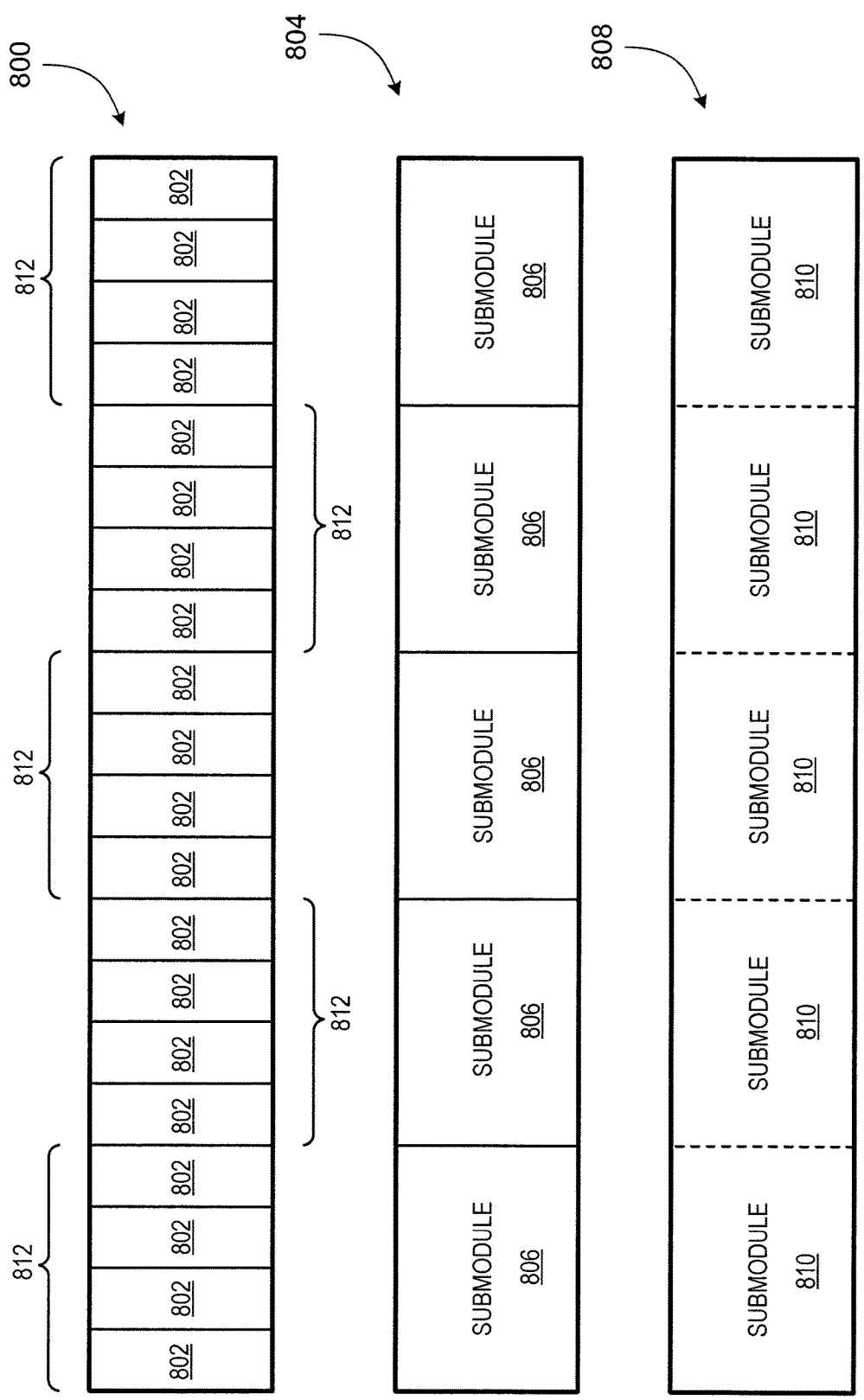
FIG. 8 is a top plan view of three flexible photovoltaic modules, according to an embodiment.

FIG. 8 is a top plan view of three flexible photovoltaic modules 800, 804 and 808, each having the same open circuit output voltage and maximum current rating. Photovoltaic module 800 has of a plurality of photovoltaic submodules 802 formed on separate, narrow web substrates. Photovoltaic submodules 802 are physically connected (e.g., via adhesives to common support materials) and electrically connected (e.g., via wiring or snap-in connections) to form photovoltaic module 800. In this example, groups of four of photovoltaic submodules 802 are connected in series to form an assembly 812 having a desired maximum voltage rating, and five assemblies 812 are then connected in parallel to achieve a desired open circuit output current. Embodiments of photovoltaic module 800 may be suitable for early-stage small web width manufacturing, or in applications where substrate web width is limited.

Photovoltaic module 804 has of a plurality of photovoltaic submodules 806, each of which is formed on a substrate having a larger web width than the substrate used to form photovoltaic submodules 802 of photovoltaic module 800. As with photovoltaic module 800, each photovoltaic submodule 806 is supported by a separate substrate. However, it may not be necessary to electrically connect photovoltaic submodules 806 in parallel within photovoltaic module 804 because photovoltaic modules 806 have a relatively large surface area, and therefore have a relatively large maximum current capability. Photovoltaic submodules 806 are physically connected together and are, for example, electrically connected in series.

Photovoltaic module 808 has of a plurality of photovoltaic submodules 810 formed on a single wide web substrate. Photovoltaic submodules 810 are, for example, monolithically integrated on the substrate. The polarity of each photovoltaic submodule 810 is alternated during the monolithic integration process to accommodate a serpentine interconnect scheme between adjacent photovoltaic submodules 810, or can maintain the same polarity with an interconnect running from the top of one submodule 810 to the bottom of the adjacent submodule. Photovoltaic submodules 810 are shown as being partially delineated by dashed lines in FIG. 8 in order to emphasize that the submodules are monolithically integrated on a common substrate, but each are electrically independent until they are interconnected as described above.

Figure 9:
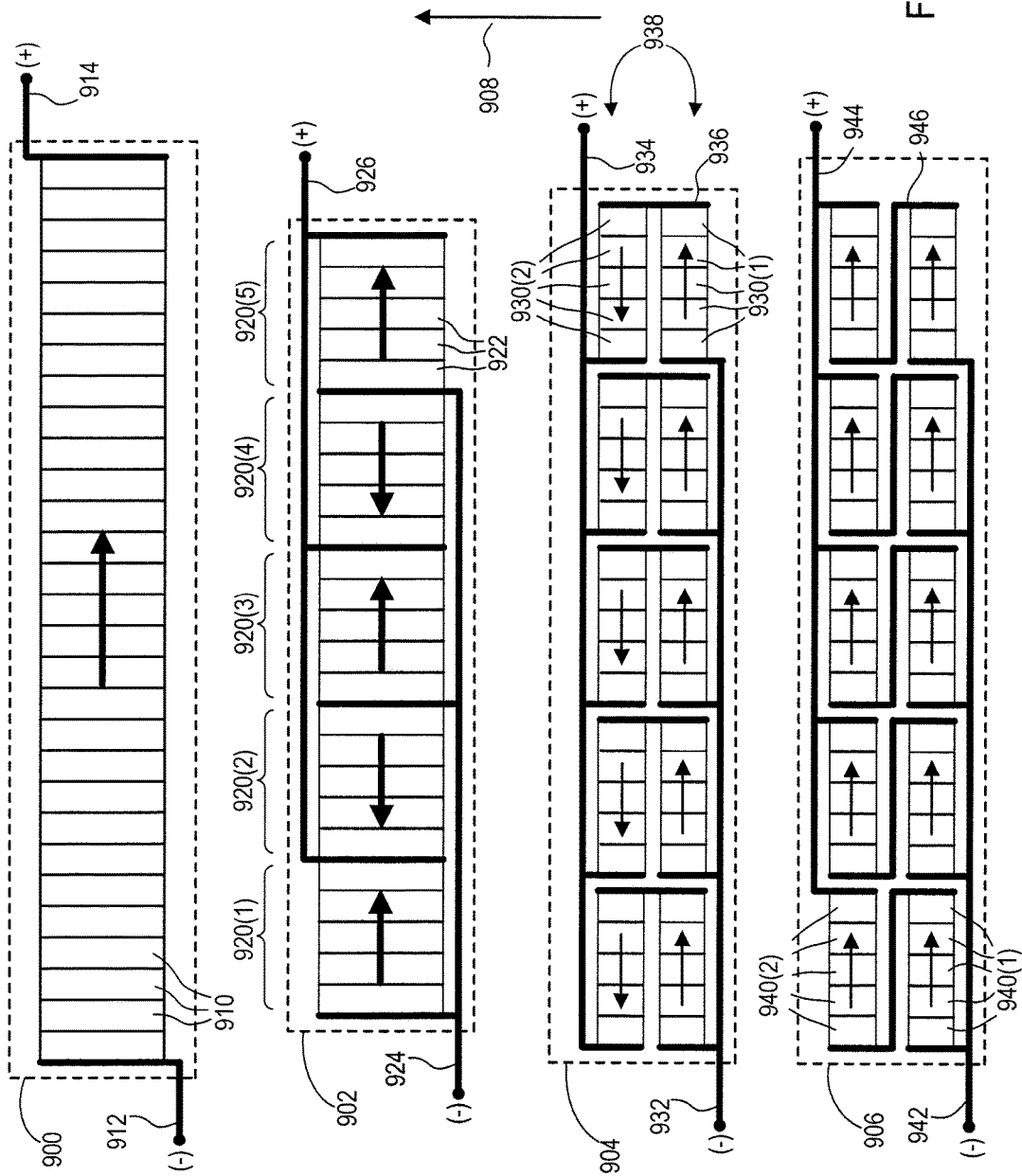
FIG. 9 is a top plan view of four flexible photovoltaic modules, according to an embodiment.

FIG. 9 is a top plan view of four flexible photovoltaic modules 900, 902, 904, and 906, each including a plurality of photovoltaic cells monolithically integrated onto common substrates. The monolithic integration scribes of photovoltaic modules 900, 902, 904, and 906 are oriented substantially parallel to the direction of web transport, as illustrated by arrow 908. However, orientation of the scribes with respect to the web transport direction may change in order to optimize photovoltaic modules 900, 902, 904, and/or 906 for cost, reliability, and manufacturing throughput.

Each of photovoltaic modules 900, 902, 904, and 906 includes at least two electrical conductors, as discussed below. Such electrical conductors are, for example, conductive ink deposited during a monolithic integration process and/or metallic bus bars.

In photovoltaic module 900, photovoltaic cells 910 are electrically connected in series such that current flows from conductor 912 to conductor 914 in the direction indicated by the arrow in photovoltaic module 900. The open circuit output voltage of photovoltaic module 900 is the sum of the open circuit output voltage of each photovoltaic cell 910. Although photovoltaic module 900 is shown as having 29 photovoltaic cells 910 in order to promote illustrative clarity, photovoltaic module 900 will commonly have a different quantity of photovoltaic cells (e.g., many more than 29 photovoltaic cells 910).

Photovoltaic module 902 has a plurality of photovoltaic submodules 920 electrically connected in parallel by conductors 924 and 926. Photovoltaic module 902 has, for example, five photovoltaic submodules 920(1), 920(2), 920(3), 920(4), and 920(5) as illustrated in FIG. 9. Although each photovoltaic submodule 920 is illustrated as including five photovoltaic cells 922 in order to promote illustrative clarity, each photovoltaic submodule may have a different quantity of photovoltaic cells 922 (e.g., significantly more than five photovoltaic cells 922). Electric current flows from conductor 924, through the photovoltaic submodules 920 as indicated by their respective arrows, and to conductor 926.

Photovoltaic module 904 has a plurality of sets of photovoltaic submodules electrically connected in parallel. Each set of photovoltaic submodules includes two photovoltaic submodules electrically connected in series. For example, one photovoltaic submodule in a set 938 includes photovoltaic cells 930(1) and the other photovoltaic submodule in set 938 includes photovoltaic cells 930(2). Photovoltaic module 904, for example, has five sets of photovoltaic submodules electrically connected in parallel. Electric current flows from conductor 932 through the photovoltaic submodules as indicated by the arrows therein, through conductors 936, and out of conductor 934.

Similar to photovoltaic module 904, photovoltaic module 906 has a plurality of sets of photovoltaic submodules electrically connected in parallel. Each set of photovoltaic submodules includes two photovoltaic submodules electrically connected in series by an electrical conductor 946. For example, one photovoltaic submodule includes photovoltaic cells 940(1), and another photovoltaic submodule includes photovoltaic cells 940(2)—each of these two of photovoltaic submodules are electrically connected by a conductor 946. Photovoltaic submodule 906 may, for example, include ten photovoltaic submodules. Although each photovoltaic submodule is illustrated as including five photovoltaic cells, each photovoltaic submodule may have a different quantity of photovoltaic cells and would likely have many more than five photovoltaic cells. Electric current flows from conductor 942, through the photovoltaic submodules as indicated by their respective arrows, conductors 946, and to conductor 944.

Figure 10:
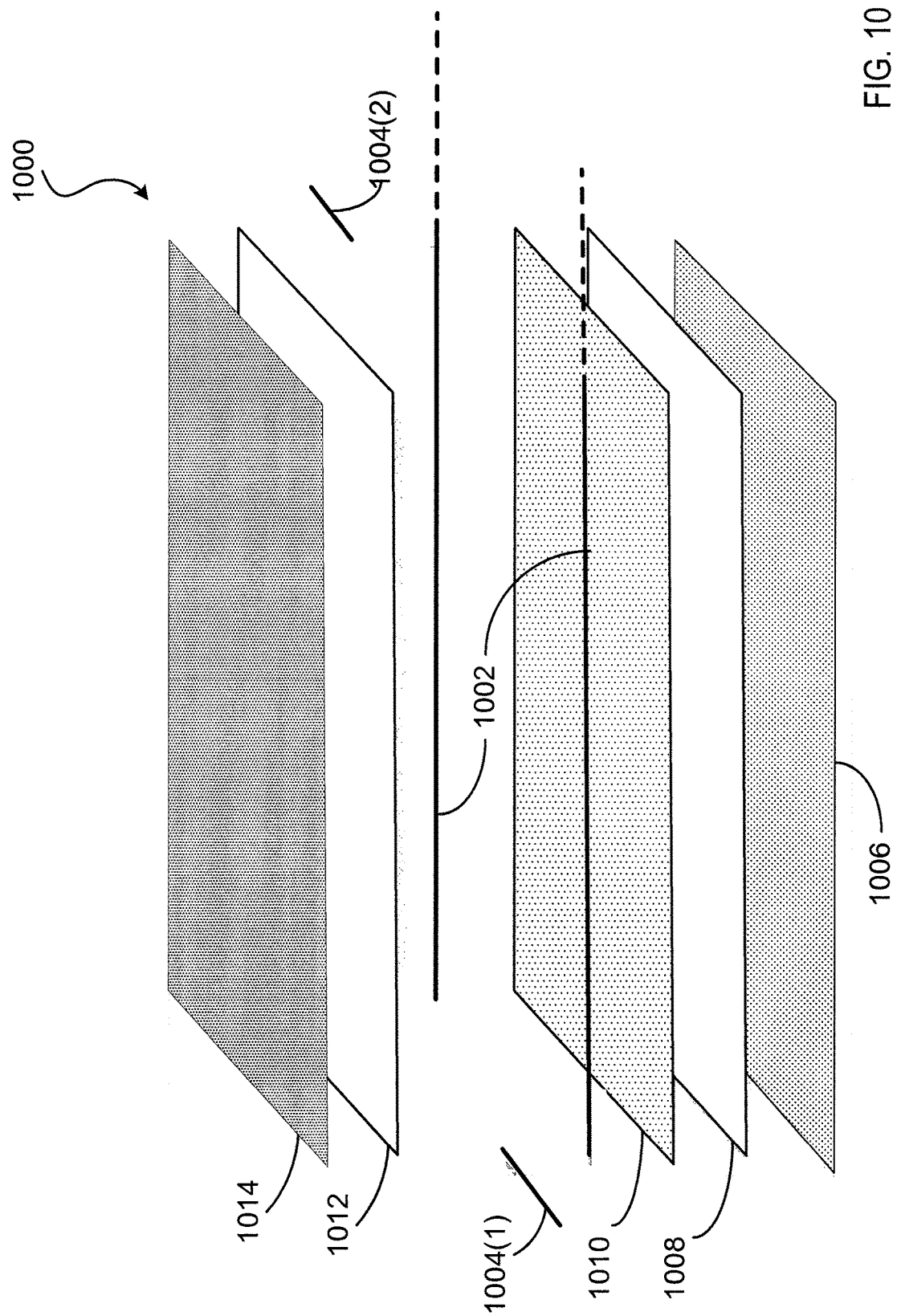
FIG. 10 is an exploded side perspective view of a photovoltaic module, according to an embodiment.

FIG. 10 is an exploded side perspective view of a photovoltaic module 1000. Photovoltaic module 1000 is, for example, a hermetically sealed laminate with integrated conductive bus bars 1002 for directing current and voltage to integrated leads 1004(1) and 1004(2). One lead 1004(1) serves to provide a connection to the positive node of photovoltaic module 1000; the other lead 1004(2) serves to provide a connection to the negative node (e.g., ground node) of photovoltaic module 1000. Module 1000 has a backplane layer 1006 supporting a pottant layer 1008, a photovoltaic submodule assembly 1010, bus bars 1002, leads 1004(1) and 1004(2), a second pottant layer 1012, and an upper laminate 1014.

Backplane layer 1006 is strong, flexible, and resistant to thermal and environmental damage, and may be made from any suitably flexible material, such as stainless steel foil, plastic, or a polymer. Backplane layer 1006 protects photovoltaic submodule 1000 from thermal and environmental stress and may include or provide a connection to a fastener for attaching photovoltaic module 1000 to a support structure. Exemplary fasteners include, but are not limited to, an adhesive, a tape, one or more screws, nails, straps or snaps, and Velcro.

Pottant layer 1008 overlies backplane layer 1006 and supports photovoltaic submodule assembly 1010. Pottant layer 1008 and a second pottant layer 1012 form an airtight seal around photovoltaic submodule assembly 1010 to prevent air from being trapped near active devices (e.g., submodules or photovoltaic cells). Pottant layer 1012 is optically transparent to allow light to reach active devices of photovoltaic submodule assembly 1010. Pottant layers 1008, 1012 may be sticky or tacky, to facilitate adhesion of module backplane layer 1006 to pottant 1008 and upper laminate 1014 to pottant layer 1012.

In one embodiment of photovoltaic module 1000, pottant layers 1008 and 1012 are formed of ethylene vinyl acetate (EVA) or polyvinyl butyral (PVB) and are applied as sheets or sprayed onto photovoltaic submodule assembly 1010. In such embodiment, backplane 1006 and upper laminate 1014 are subsequently pressed or laminated to the pottant layers. In another embodiment of photovoltaic module 1000, pottant layers 1008 and 1012 are protective laminates applied to photovoltaic submodule assembly 1010.

Additives may be combined with the pottant layer material to increase cut, puncture, or abrasion resistance of the pottant layers. Additives may likewise be incorporated into the pottant layer material to change its aesthetic appearance, to increase its sealing properties, or to enhance overall photovoltaic module 1000 stability and/or performance.

Figure 11:
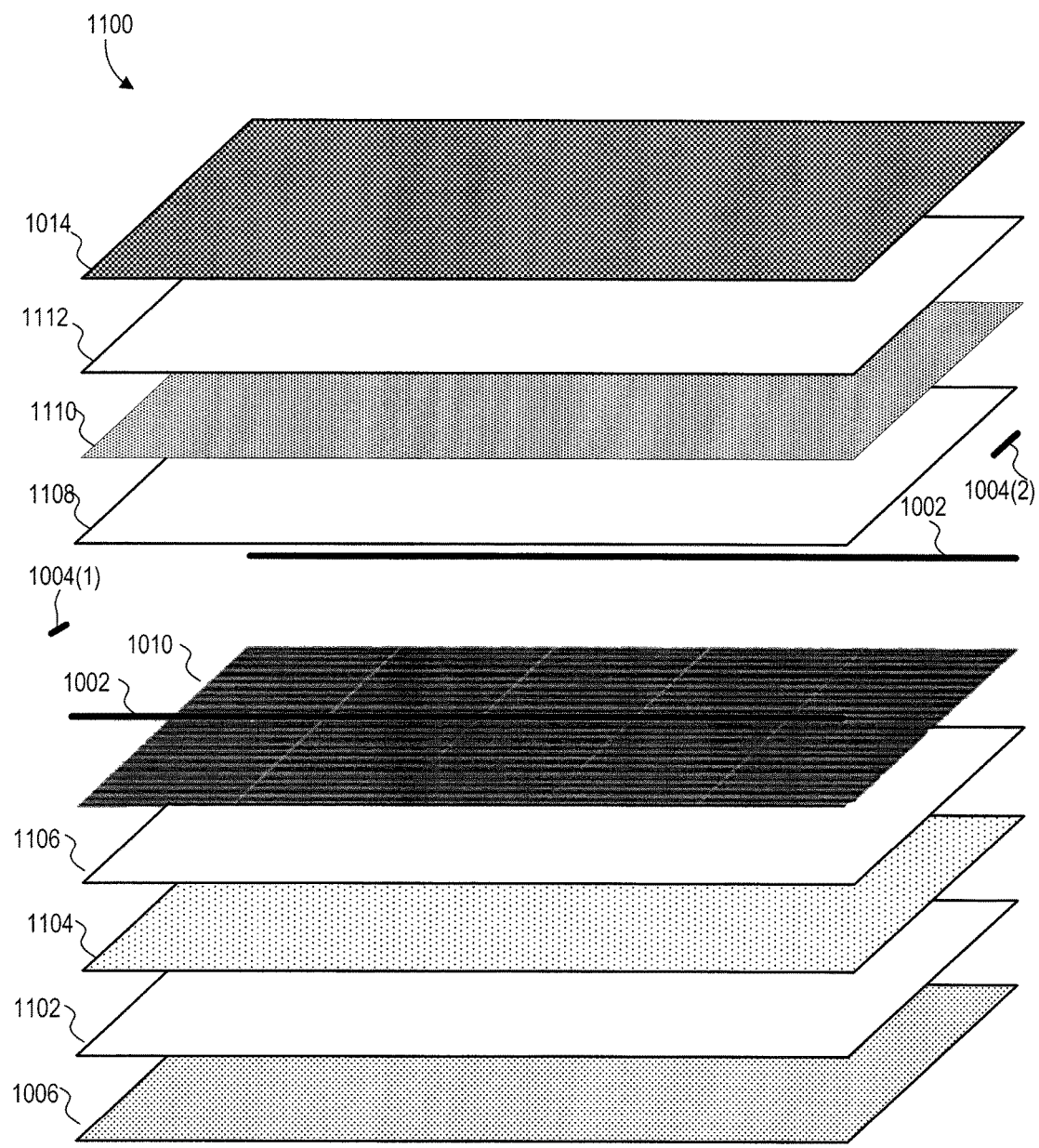
FIG. 11 is an exploded side perspective view of a photovoltaic module, according to an embodiment.

Optionally, layers of additive may be sandwiched between pottant layers on either side of photovoltaic submodule assembly 1010. For example, FIG. 11 shows an exploded side view of a flexible photovoltaic module 1100, which is similar to photovoltaic module 1000 with the exception that photovoltaic module 1100 contains additive layers and additional pottant layers. Photovoltaic module 1100 includes four pottant sublayers and two additive layers. Pottant sublayer 1102 is formed on backplane layer 1006, additive layer 1104 is formed on pottant sublayer 1102, and pottant sublayer 1106 is formed on additive layer 1104. Additionally, pottant sublayer 1108 is formed on photovoltaic submodule assembly 1010, additive layer 1110 is formed on pottant sublayer 1108, and pottant sublayer 1112 is formed on additive layer 1110.

Returning to FIG. 10, upper laminate 1014 protects photovoltaic module 1000 from wear and tear as well as environmental stresses such as weather, ultraviolet radiation, dirt, and debris. Upper laminate 1014 may be a suitable polymer, plastic, or other optically transparent, protective material. Upper laminate 1014 may be applied by lamination or spraying. In one embodiment, upper laminate 1014 is an outer surface of the second pottant layer 1012.

Photovoltaic submodule assembly 1010 includes a plurality of thin-film, monolithically-integrated photovoltaic cells, as described herein above. Photovoltaic submodule assembly 1010 has, for example, submodules like submodule 200 or submodules like those of one of photovoltaic modules 300, 400, 500, 502, 600, 602, 604, 700, 702, 704, 800, 804, 808, 900, 902, 904, and 906 discussed above. In one embodiment, photovoltaic submodule assembly 1010 is a solar "blanket" with five or fewer monolithically integrated, interconnected CIGS cell photovoltaic submodules. The photovoltaic submodules are connected in series or in parallel such that photovoltaic module 1000 has a desired maximum current capability and open circuit output voltage. The open circuit output voltage will be the sum of the open circuit output voltage of each photovoltaic cell and/or photovoltaic submodule electrically connected in series. For example, photovoltaic module 1000 may include five photovoltaic submodules electrically connected in series. If each photovoltaic submodule has an open circuit output voltage of 120 V, photovoltaic module 1000 has an open circuit output voltage of 600 V.

Bus bars 1002 and leads 1004 may extend from module 1000 for connection to harnesses containing flexible conductors (e.g., conductors 1208 in FIG. 12 below). Such harnesses are for example seamed to photovoltaic module 1000. In one embodiment, flexible conductors (e.g., conductors 1208) are incorporated into photovoltaic module 1000 (with electrical connection points), for example by extending backplane and top laminate width to account for such conductors.

The size and shape of photovoltaic module 1000 may be modified by computer-aided design to fit the needs of a specific installation site while maintaining appropriate electrical characteristics for a given photovoltaic module. In an embodiment, a roof is measured and an array of photovoltaic modules 1000 is designed for maximum coverage of the roof. Photovoltaic modules 1000 are manufactured in a variety of custom sizes (e.g., fitted to optimally surround any obstructions), for example using laser patterning. Where the roof is free from obstructions, photovoltaic modules may be manufactured as long as permitted by the maximum current for each photovoltaic module, e.g., approximately one hundred and fifty feet when limiting module current to 10 amps. Embodiments of photovoltaic modules 1000 may rolled up for easy transportation and placement (un-rolling) at an installation site (e.g., a roof).

As an example, consider an installation site consisting of a roof with a length of 150 feet. The roof includes the following obstructions: (a) two five feet wide vents, each located 20 feet from opposite ends of the roof, and (b) an eight feet wide skylight centered between the two vents. Four photovoltaic modules 1000 may be formed to optimally cover the roof. Two of such photovoltaic modules have a length of twenty feet, and two of the photovoltaic modules have a width of 46 feet. Although such photovoltaic modules have varying lengths, they each have the same open circuit output voltage allowing them to be electrically connected in parallel.

Figure 12:
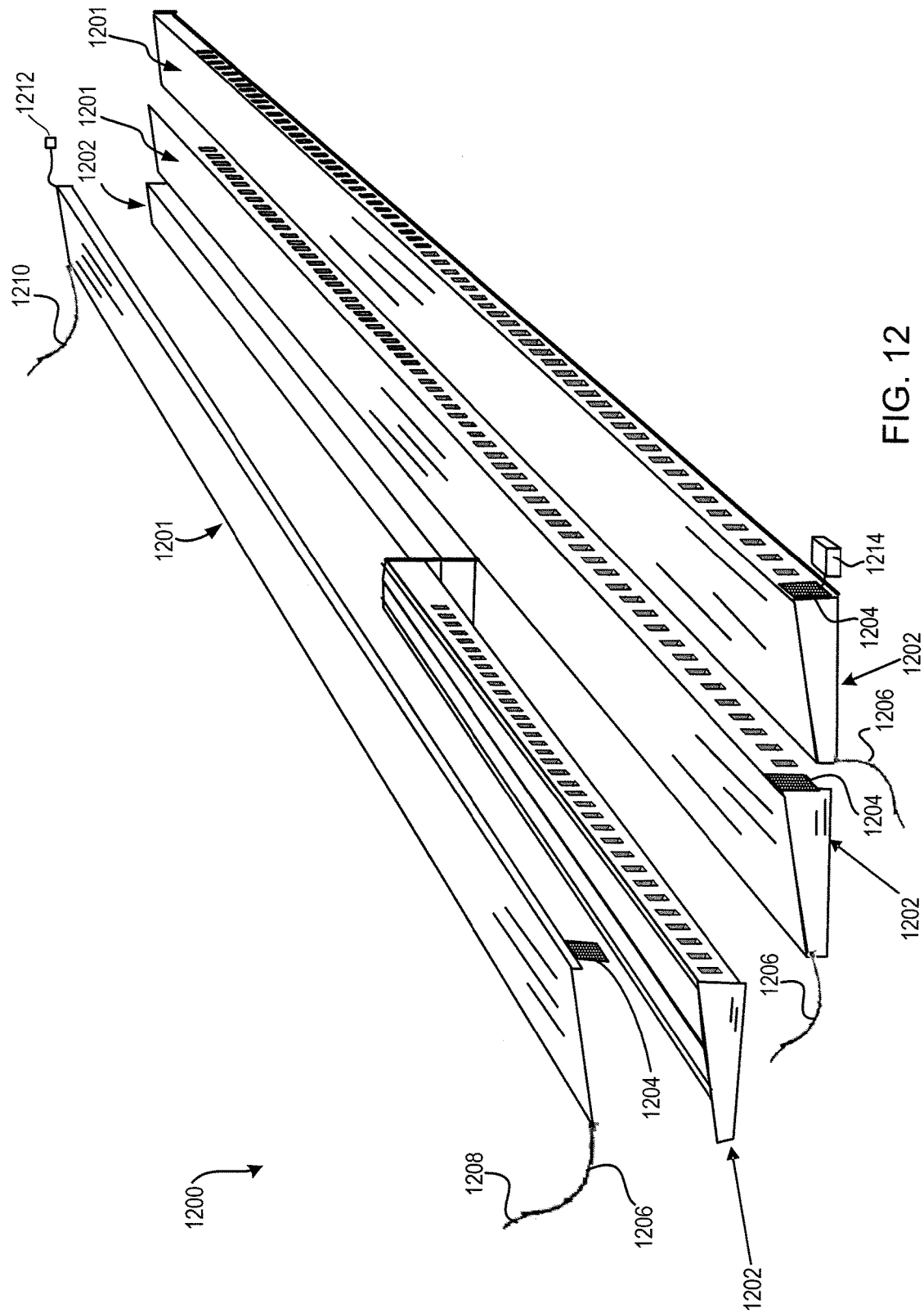
FIG. 12 is a side perspective view of one solar power generation system, according to an embodiment.

FIG. 12 is a side perspective view of a solar power generation system 1200. Solar power generation system 1200 includes a plurality of photovoltaic modules 1201, which are, for example, one or more of the photovoltaic modules discussed above. Photovoltaic modules 1201 are installed on supports 1202. Supports 1202 are, for example, formed of foam, metal, wood, and/or other suitable building material. Supports may be solid, partially filled, and/or frames. Photovoltaic modules 1201 attach to supports 1202 with adhesives, screws, staples, Velcro, zip lock and/or other fasteners. Photovoltaic modules 1201 are electrically connected in parallel by control boxes 1204, wiring harnesses 1206 containing multiple flexible conductors 1208 (shown without shielding, for clarity), and by harness ground strap or ground jumper 1210 with molded ground connector 1212. Ground connector 1212, for example, snaps into ground jumper 1210, and harness 1206 fits, or is trimmed to fit, control box 1204.

Control box 1204 houses or supports the following: (a) a current limiting device such as a fuse, (b) a switch for disconnecting a respective photovoltaic module, (c) two connection blocks for connecting wiring harnesses 1206, and (d) a selector switch for selecting a flexible conductor for connection to the control box's respective photovoltaic module 1201. Interconnected photovoltaic modules 1201 are electrically connected to distribution box 1214, which connects to an inverter, for example.

Figure 13:
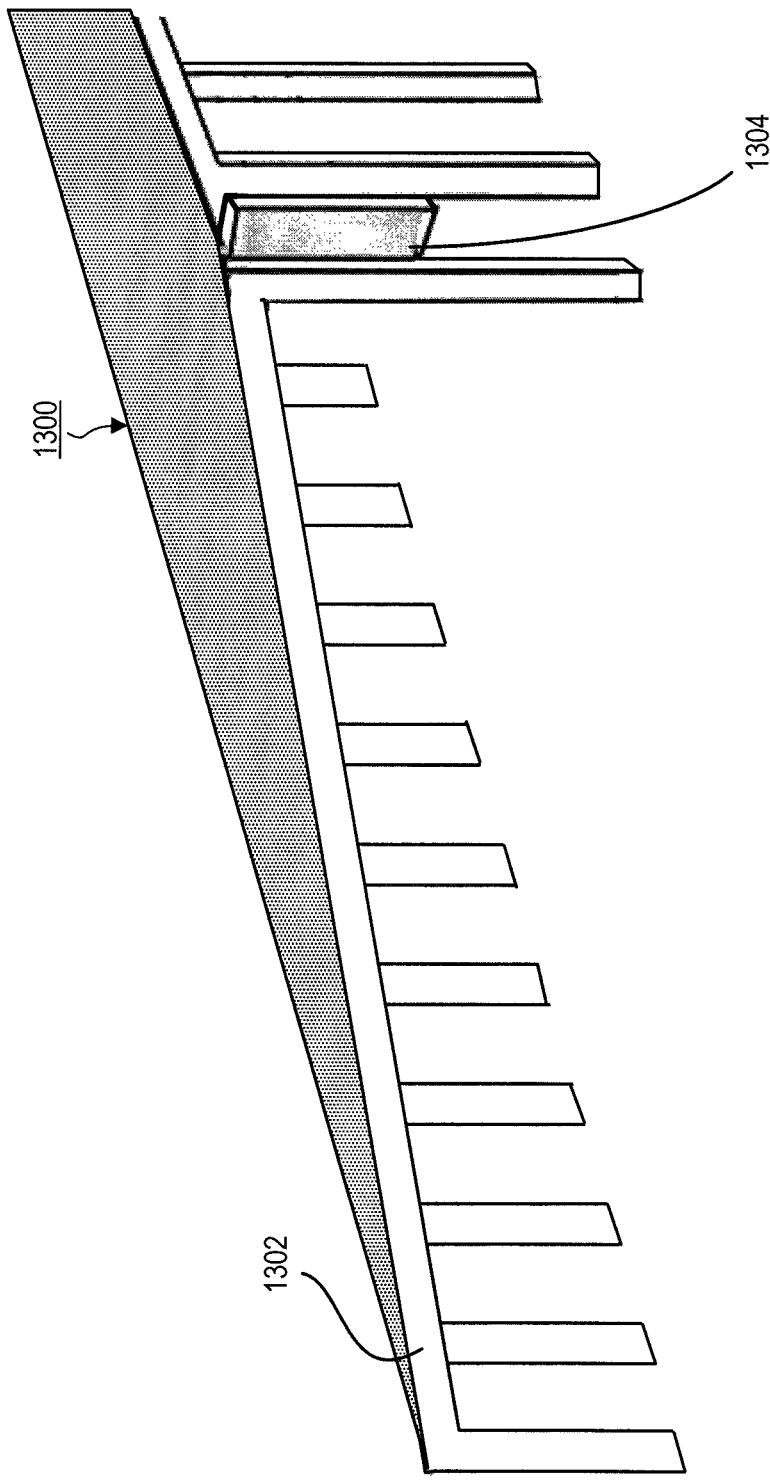
FIG. 13 is a side perspective view of a photovoltaic module installed on a support structure, according to an embodiment.

FIG. 13 is a side perspective view of a photovoltaic module 1300 installed on a support structure 1302. Photovoltaic module 1300 is mounted on support structure 1302, which is formed of an aluminum frame. Photovoltaic module 1300 is electrically connected to control box 1304, which is mounted to support structure 1300.

Figure 14:
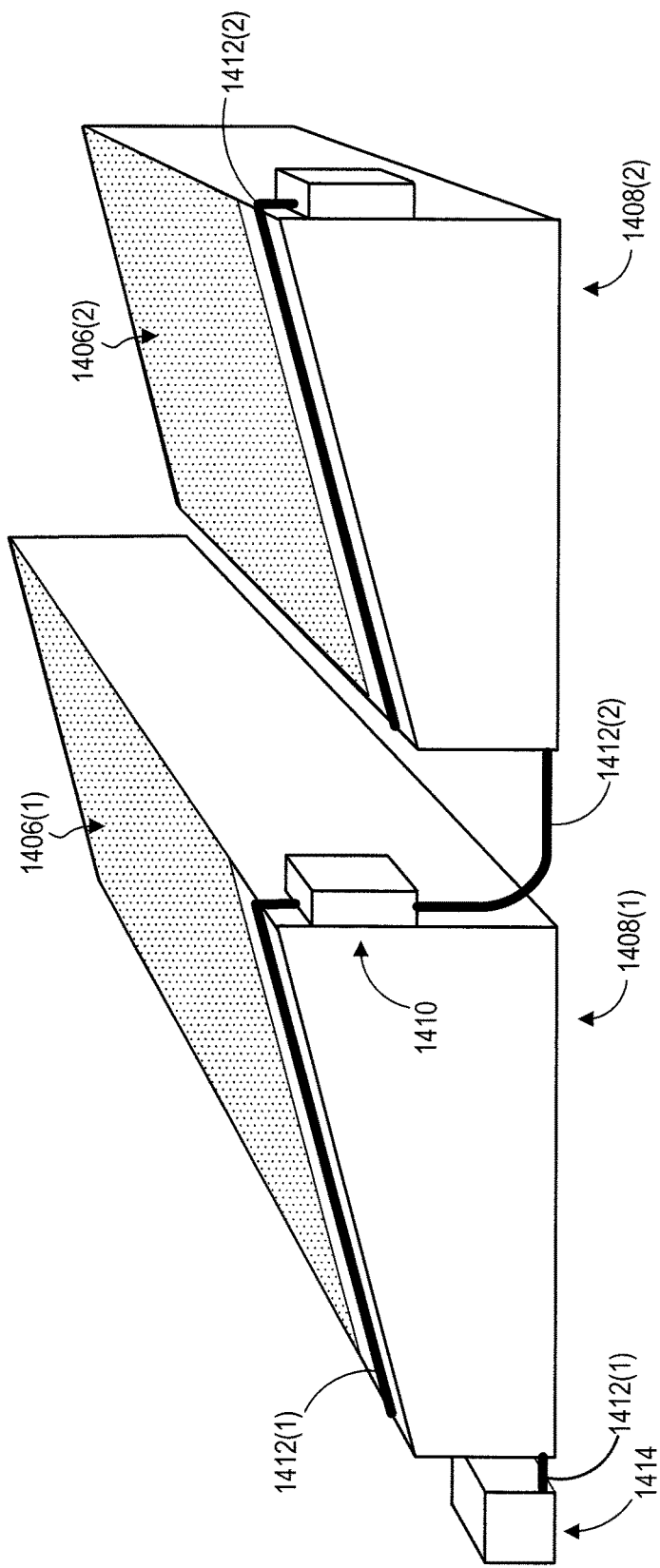
FIG. 14 is a side perspective view of photovoltaic modules installed on support structures, according to an embodiment.

FIG. 14 is a side perspective view of photovoltaic modules 1406(1) and 1406(2) installed on respective support structures 1408(1) and 1408(2). Support structures 1408 are foam wedges. Photovoltaic module 1406(1) is electrically connected to control box 1410, and photovoltaic module 1406(2) is also electrically connected to control box 1410 (and thereby to photovoltaic module 1406(1)) via a wiring harnesses 1412(2). Photovoltaic module 1406(1) includes wiring harness 1412(1) connecting photovoltaic module 1406(1) to junction box 1414, which interfaces photovoltaic modules 1406(1) and 1406(2) to an additional system (e.g., a load consisting of an inverter).

In one embodiment, harnesses 1412 contain multiple flexible conductors and include shielding to protect against abrasion, puncture or other damage. Wiring harness 1412(1) of photovoltaic module 1406(1), for example, snaps, slides, or plugs into a lead of wiring harness 1412(2) of photovoltaic module 1406(2), or vice versa.

Control box 1410 serves as connection point—that is, control box 1410 facilitates connection of photovoltaic module 1406(1) to 1406(2). Control box 1410 may also serve to perform other functions, such as to providing a means to electrically disconnect photovoltaic module 1406 (1) from wiring harnesses 1412(1) and 1412(2).

Since certain changes may be made in the above apparatus, systems and methods without departing from the scope hereof, it is intended that all matter contained in the above description or shown in the accompanying drawings be interpreted as illustrative and not in a limiting sense. It is also to be understood that the following claims are to cover certain generic and specific features described herein.

What is claimed is:

1. A method for forming a photovoltaic module, comprising:
    disposing a stack of thin-film layers on a flexible substrate;
    creating a plurality of scribes and electrical connections in the stack of thin-film layers to form a plurality of photovoltaic submodules on the flexible substrate, each of the plurality of photovoltaic submodules including a plurality of electrically-connected photovoltaic cells; and
    electrically connecting the plurality of photovoltaic submodules to form a photovoltaic submodule assembly;
    wherein each of the plurality of photovoltaic submodules is electrically independent and electrically isolated from each other before the step of electrically connecting the plurality of photovoltaic submodules.

2. The method of claim 1, the step of disposing the stack of thin-film layers comprising:
    disposing a back contact layer on the flexible substrate;
    disposing a solar absorber layer on the back contact layer;
    disposing a window layer on the solar absorber layer; and
    disposing a top contact layer on the window layer.

3. The method of claim 2, further comprising:
    electrically coupling leads to the photovoltaic submodule assembly; and
    laminating the photovoltaic submodule assembly.

4. The method of claim 3, the step of laminating comprising disposing the photovoltaic submodule assembly between a backplane layer and an upper laminate.

5. The method of claim 4, the step of laminating further comprising:
    disposing a first pottant layer between the backplane layer and the photovoltaic submodule assembly; and
    disposing a second pottant layer between the photovoltaic submodule assembly and the upper laminate.

6. The method of claim 2, the flexible substrate comprising a flexible web substrate, and the step of creating the plurality of scribes and electrical connections in the stack of thin-film layers comprising using a continuous web, roll-to-roll, processing system to create the plurality of scribes and electrical connections.

7. The method of claim 6, the step of creating the plurality of scribes and electrical connection in the stack of thin-film layers comprising creating scribes parallel to a direction of transport of the flexible web substrate in the continuous web, roll-to-roll, processing system.

8. The method of claim 6, the step of creating the plurality of scribes and electrical connection in the stack of thin-film layers comprising creating scribes perpendicular to a direction of transport of the flexible web substrate in the continuous web, roll-to-roll, processing system.

9. The method of claim 6, further comprising inputting specifications into a computer controlling the continuous web, roll-to-roll, processing system to determine a number of photovoltaic cells electrically coupled in series in each of the plurality of photovoltaic modules.

10. The method of claim 2, the step of electrically connecting the plurality of photovoltaic submodules comprising electrically connecting the plurality of photovoltaic submodules using electrically conductive flexible bus bars.

11. The method of claim 2, the step of electrically connecting the plurality of photovoltaic submodules comprising electrically connecting the plurality of photovoltaic submodules using electrically conductive ink.

12. The method of claim 2, the step of electrically connecting the plurality of photovoltaic submodules comprising:
    determining an electrical topology of the photovoltaic submodule assembly which achieves a predetermined electrical characteristic of the photovoltaic submodule assembly; and
    electrically connecting the plurality of photovoltaic submodules to realize the electrical topology.

13. The method of claim 12, the predetermined electrical characteristic of the photovoltaic submodule assembly comprising a predetermined open circuit voltage of the photovoltaic submodule assembly.

14. The method of claim 13, the predetermined electrical characteristic of the photovoltaic submodule assembly comprising a predetermined maximum current capability of the photovoltaic submodule assembly.

* * * * *